US009627788B2

(12) United States Patent
Armstrong et al.

(10) Patent No.: US 9,627,788 B2
(45) Date of Patent: Apr. 18, 2017

(54) ELECTRICAL HARNESS CONNECTOR

(71) Applicant: ROLLS-ROYCE PLC, London (GB)

(72) Inventors: Daniel Martin Armstrong, Chester (GB); Simon Thomas Cort, Cannock (GB)

(73) Assignee: ROLLS-ROYCE plc, London (GB)

( * ) Notice: Subject to any disclaimer, the term of this patent is extended or adjusted under 35 U.S.C. 154(b) by 79 days.

(21) Appl. No.: 14/830,280

(22) Filed: Aug. 19, 2015

(65) Prior Publication Data
US 2016/0072210 A1    Mar. 10, 2016

(30) Foreign Application Priority Data

Sep. 10, 2014    (GB) .................................. 1416014.7

(51) Int. Cl.
*H05K 1/00*     (2006.01)
*H01R 12/78*    (2011.01)
(Continued)

(52) U.S. Cl.
CPC ............... *H01R 12/78* (2013.01); *F02C 7/00* (2013.01); *F02C 7/32* (2013.01); *H01R 12/61* (2013.01); *H01R 43/205* (2013.01); *H05K 3/363* (2013.01); *F05D 2230/238* (2013.01); *H01R 13/6594* (2013.01); *H05K 1/144* (2013.01); *H05K 1/147* (2013.01); *H05K 2201/058* (2013.01); *H05K 2201/10242* (2013.01); *H05K 2201/10295* (2013.01); *H05K 2201/10303* (2013.01); *Y02T 50/672* (2013.01)

(58) Field of Classification Search
USPC ......................................... 361/749, 748, 750
See application file for complete search history.

(56) References Cited

U.S. PATENT DOCUMENTS

| 3,537,176 A | 11/1970 | Healy et al. |
| 2002/0007967 A1 | 1/2002 | Yamanashi et al. |

(Continued)

FOREIGN PATENT DOCUMENTS

| DE | 3425475 A1 | 1/1986 |
| DE | 201 07 820 U1 | 8/2001 |

(Continued)

OTHER PUBLICATIONS

Feb. 12, 2016 Extended Search Report issued in European Patnent Application No. 15181374.8.

(Continued)

*Primary Examiner* — Andargie M Aychillhum
(74) *Attorney, Agent, or Firm* — Oliff PLC

(57) ABSTRACT

An electrical assembly is disclosed in which two flexible printed circuits are electrically joined. This allows greater lengths of flexible printed circuits to be provided, for example for gas turbine engine harnesses. Each flexible printed circuit has a terminating region having electrically conductive through holes that are connected to respective electrical tracks of the flexible printed circuit. The terminating regions are adjacent each other in the electrical assembly, and an electrically conductive pin is passed through the aligned through holes, then permanently bonded in position, for example by welding. This results in a robust, reliable connection of two flexible printed circuits.

15 Claims, 6 Drawing Sheets

(51) Int. Cl.
 *H05K 3/36* (2006.01)
 *H01R 43/20* (2006.01)
 *F02C 7/32* (2006.01)
 *F02C 7/00* (2006.01)
 *H01R 12/61* (2011.01)
 *H05K 1/14* (2006.01)
 *H01R 13/6594* (2011.01)

(56) References Cited

U.S. PATENT DOCUMENTS

| | | |
|---|---|---|
| 2007/0030681 A1 | 2/2007 | Farrell et al. |
| 2008/0128153 A1 | 6/2008 | Lietz |
| 2009/0239401 A1* | 9/2009 | Fink .................... H01R 12/592 439/214 |
| 2012/0315773 A1* | 12/2012 | Esquivel ............. H01R 12/716 439/67 |
| 2013/0189868 A1 | 7/2013 | Fitt et al. |
| 2014/0144678 A1 | 5/2014 | Lin et al. |

FOREIGN PATENT DOCUMENTS

| | | |
|---|---|---|
| EP | 2 590 267 A2 | 5/2013 |
| EP | 2800207 A2 | 11/2014 |
| JP | 2012064478 A | 3/2012 |
| WO | 2012/035863 A1 | 3/2012 |

OTHER PUBLICATIONS

Mar. 12, 2015 Search Report in Great Britain Patent Application No. 1416014.7.

\* cited by examiner

ELECTRICAL HARNESS CONNECTOR

CROSS-REFERENCE TO RELATED APPLICATIONS

This application is based upon and claims the benefit of priority from British Patent Application Number 1416014.7 filed 10 Sep. 2014, the entire contents of which are incorporated by reference.

BACKGROUND

1. Field of the Disclosure

The present disclosure relates to connecting joining two flexible printed circuits.

The present disclosure relates to an electrical system, for example an electrical system of a gas turbine engine.

2. Description of the Related Art

A typical gas turbine engine has a substantial number of electrical components which serve, for example, to sense operating parameters of the engine and/or to control actuators which operate devices in the engine. Such devices may, for example, control fuel flow, variable vanes and air bleed valves. The actuators may themselves be electrically powered, although some may be pneumatically or hydraulically powered, but controlled by electrical signals.

Electrical power, and signals to and from the individual electrical components, is commonly transmitted along conductors. Conventionally, such conductors may be in the form of wires and/or cables which are assembled together in a harness. In such a conventional harness, each wire may be surrounded by an insulating sleeve, which may be braided or have a braided cover.

By way of example, FIG. 1 of the accompanying drawings shows a typical gas turbine engine including two conventional wiring harnesses 102, 104, each provided with a respective connector component 106, 108 for connection to circuitry, which may be for example accommodated within the airframe of an aircraft in which the engine is installed.

The harnesses 102, 104 are assembled from individual wires and cables which are held together over at least part of their lengths by suitable sleeving and/or braiding. Individual wires and cables, for example those indicated at 110, emerge from the sleeving or braiding to terminate at plug or socket connector components 112 for cooperation with complementary socket or plug connector components 114 on, or connected to, the respective electrical components.

Each conventional harness 102, 104 comprises a multitude of insulated wires and cables. This makes the conventional harness itself bulky, heavy and difficult to manipulate. The conventional harnesses occupy significant space within a gas turbine engine (for example within the nacelle of a gas turbine engine), and thus may compromise the design of the aircraft, for example the size and/or weight and/or shape of the nacelle.

Conventional harnesses comprise a large number of components, including various individual wires and/or bundles of wires, supporting components (such as brackets or cables) and electrical and/or mechanical connectors. This can make the assembly process complicated (and thus susceptible to errors) and/or time consuming. Disassembly of the conventional harnesses (for example removal of the conventional harnesses from a gas turbine engine during maintenance) may also be complicated and/or time consuming. Thus, in many maintenance (or repair or overhaul) procedures on a gas turbine engine, removal and subsequent refitting of the conventional electrical harness may account for a very significant portion of the operation time and/or account for a significant proportion of the potential assembly errors.

The electrical conductors in the conventional harnesses may be susceptible to mechanical damage. For example, mechanical damage may occur during installation (for example through accidental piercing of the protective sleeves/braiding) and/or during service (for example due to vibration). In order to reduce the likelihood of damage to the conductors in a conventional harness, the protective sleeves/braiding may need to be further reinforced, adding still further weight and reducing the ease with which they can be manipulated.

Similarly, the exposed electrical connectors used to connect one conductor to another conductor or conductors to electrical units may be susceptible to damage and/or may add significant weight to the engine.

OBJECTS AND SUMMARY

It is proposed to replace the wires of a conventional harness at least in part with a flexible printed circuit. A reliable, straightforward and lightweight arrangement for connecting flexible printed circuits together is required, for example to extend the length of conventional flexible printed circuits for use in gas turbine engine harnesses. Such a reliable, straightforward and lightweight arrangement for connecting flexible printed circuits together may also be advantageous in a number of other fields, in addition to that of gas turbine engine harnesses.

According to an aspect, there is provided an electrical assembly comprising a first flexible printed circuit and a second flexible printed circuit. Each of the first flexible printed circuit and the second flexible printed circuit comprises a plurality of respective electrically conductive tracks embedded in a flexible material. Each flexible printed circuit also comprises a terminating region having terminating holes extending therethrough. Tracks of the flexible printed circuit terminate at a terminating hole. In the electrical assembly, the respective terminating regions of the first and second flexible printed circuits are directly adjacent each other. The electrical assembly also comprises a plurality of connection pins. Each connection pin extends between a respective terminating hole of the first and second flexible printed circuits. Each connection pin is permanently bonded to its respective terminating holes so as to form a permanent electrical connection between respective tracks of the first and second flexible printed circuits.

According to an aspect, there is provided a method of electrically connecting a first flexible printed circuit to a second flexible printed circuit. Each flexible printed circuit comprises: a plurality of electrically conductive tracks embedded in a flexible material; and a terminating region having terminating holes extending therethrough, each of the tracks of the flexible printed circuit terminating at a terminating hole. The method comprises positioning the respective terminating regions of the first and second flexible printed circuits directly adjacent each other. The method comprises providing a connection pin (that is, one or more connection pins) between respective adjacent terminating holes of the first and second flexible printed circuits. The method comprises permanently bonding the (or each) connection pin to its respective terminating holes so as to form a permanent electrical connection between respective tracks of the first and second flexible printed circuits.

The terminating regions of the first and second flexible printed circuits are directly adjacent each other in the electrical assembly, meaning that there may be no intermediate structure or material. There may or may not be a gap (for example an air gap) between the respective terminating regions. The connection pins may be held in position by virtue of the permanent bonding to the respective terminating holes.

Each terminating region may be described as being a substantially flat structure having an upper (or first) major surface separated by a thickness from a lower (or second) major surface. In the electrical assembly, one of the major surfaces (for example the upper major surface) of the terminating region of one flexible printed circuit may be said to be next to, or directly adjacent, one of the major surfaces (for example the lower major surface) of the other flexible printed circuit.

Electrical assemblies, and methods for connecting flexible printed circuits, described and/or claimed herein provide a reliable, secure and robust connection of two flexible printed circuits. The permanent bond may help to ensure continuity of electrical connection between the tracks of the flexible printed circuits, for example throughout a range of operating (or environmental) conditions and over a prolonged period of time. The electrical assembly may be said to be permanent, and once assembled may provide continuous connection between the flexible printed circuits for the life of the component, for example without requiring maintenance or disassembly. Disassembly of the first flexible printed circuit from the second flexible printed circuit may not be possible once the connection pin has been permanently bonded in position. The connection may be considered to be non-repairable.

The permanent bond may be formed by an electrically conductive material, such as a metal. The permanent bond may be formed by solder, for example. The permanent bond may be formed by any suitable process, such as welding, brazing and/or soldering, for example.

The terminating regions may be said to be substantially planar. Each terminating hole may have a longitudinal axis that is perpendicular to the terminating regions. The terminating regions may be positioned such that longitudinal axes of the terminating holes of the first flexible printed circuit are aligned with longitudinal axes of corresponding terminating holes of the second flexible printed circuit. The tracks of a flexible printed circuit may diverge at the terminating region. At least some of the tracks may spread apart from each other to meet their respective terminating holes.

At least one of the pins may provide an electrical connection only between a single electrical track in the first flexible printed circuit and a single electrical track in the second flexible printed circuit. In this way, an electrical signal passing along a track of one flexible printed circuit may pass through a connecting pin and along a track of another, connected, flexible printed circuit.

Each flexible printed circuit may be described as a thin body having an upper major surface separated by a thickness from a lower major surface. Each flexible printed circuit may comprise any number of layers of electrical tracks embedded within the thickness of the flexible printed circuit. For example, one or at least two layers of electrical tracks may be embedded within the thickness of each flexible printed circuit.

Each flexible printed circuit may comprise an electromagnetic shielding layer. At least two electromagnetic shielding layers (which may be parallel to upper and lower major surfaces of the flexible printed circuit) may be provided within the thickness of each flexible printed circuit. At least two shielding layers in each flexible printed circuit may be electrically connected to the same terminating hole. At least one connection pin may be permanently bonded to the respective terminating holes of the first and second flexible printed circuits to which the shielding layers are connected so as to form a permanent electrical connection between at least two electromagnetic shielding layers of both the first flexible printed circuit and the second flexible printed circuit.

The electromagnetic shielding layers may take any suitable form, such as a metallic layer (for example copper), which may be continuous or in the form of a mesh.

The electrical tracks and (where present) the electromagnetic shielding layer(s) may be described as electrically conductive features. Such electrically conductive features embedded in the first flexible printed circuit may be arranged to be substantially the same as electrically conductive features embedded in the second flexible printed circuit. Thus, for example, the topological arrangement of electrical tracks in the first flexible printed circuit may be the same as the topological arrangement of electrical tracks in the second flexible printed circuit. For example, the flexible printed circuits may comprise the same number of electrical tracks, the same number of layers of electrical tracks, the same number of tracks in each layer, and/or the same number and/or positioning of electromagnetic shield layers. Accordingly, the second flexible printed circuit may be regarded simply as an extension or elongation of the first flexible printed circuit.

The inner surface of the terminating holes may be electrically conductive. For example, the inner surface of the terminating holes may be plated with a conductive material, such as metal.

According to an aspect, there is provided a rigid electrical panel comprising the electrical assembly as described and/or claimed herein embedded in a rigid material. At least a part of the rigid material may be an organic matrix composite, such as carbon fibre.

Such a rigid electrical panel may be formed by any suitable method. For example, according to an aspect, there is provided a method of manufacturing a rigid electrical panel. The method comprises electrically connecting first and second flexible printed circuits as described and/or claimed herein. The method comprises laying the connected flexible printed circuits onto an organic matrix composite, which may be an un-cured organic matrix composite. The method comprises covering the connected flexible printed circuits with a covering material (which may, for example, be a plastic material which may or may not be fibre-reinforced, for example an organic matrix composite) so as to sandwich the connected flexible printed circuits between the organic matrix composite and the covering material to form an assembly, which may be referred to as an un-cured assembly. The method comprises curing the assembly to form a rigid electrical panel having the connected flexible printed circuits embedded between a cured organic matrix composite and the covering material.

Regardless of the method used to manufacture such a rigid electrical panel, the robust connection between the first and second flexible printed circuits ensures that the electrical connection remains intact and/or undamaged during manufacture of the panel (and thereafter).

The terminating regions of the first and second flexible printed circuits and the connecting pins embedded in such a rigid electrical panel may be surrounded by an electrically insulating material, such as polyetheretherketone (PEEK), for example.

Such an electrical panel may form part of an electrical system, such as an electrical system for a gas turbine engine or vehicle, for example an electrical harness for a gas turbine engine or vehicle.

According to an aspect, there is provided a gas turbine engine comprising an electrical harness that comprises a rigid electrical panel as described and/or claimed herein. The rigid electrical panel may comprise at least one electrical connector having a first end that is embedded in the rigid material and is electrically connected to one or more electrical tracks of the first and/or second flexible printed circuit, and an exposed second end at which electrical terminals are provided for electrical connection to another electrical component. The rigid electrical panel may be mounted on a rigid structure of the gas turbine engine, such as on a casing (for example a fan casing or a core casing) or on a bifurcation structure that crosses a bypass duct of a turbofan engine. In such an arrangement, the connector may allow electrical tracks of the first and/or second harness to be electrically connected to other components outside the rigid electrical panel, such as other conductors (which may be in the form of wires and/or flexible printed circuits), and/or electrical units, such as an EEC (engine electronic controller) or EHM (engine health monitoring unit). The connector may be said to be at least partly embedded in the rigid electrical panel.

In any arrangement described and/or claimed herein, the electrical panel may comprise (and/or be provided with) at least one passage in the rigid material. The or each passage may be for passing a fluid therethrough in use. The fluid passage may be part of a fluid system, such as a gas (for example pneumatic or cooling gas/air) and/or liquid (for example a fuel, hydraulic and/or lubricant liquid). Accordingly, the electrical panel may be able both to transmit electrical signals/power and carry fluids, for example around a gas turbine engine. Accordingly, the single panel may be able to replace both fluid pipes and individual electrical wires of conventional fluid and electrical systems of a gas turbine engine.

An electrical panel may be formed in any desired shape, for example in a shape that corresponds to the shape of a casing of a gas turbine engine, such as a fan case, a compressor case, or a turbine case. In this regard, the term "corresponds to" may mean, for example, that the shape of the electrical panel is an offset shape from the shape of the casing.

An electrical panel may be provided in any suitable location/position of a gas turbine engine. For example, the gas turbine engine may comprise a bypass flow duct formed between an engine core and an engine fan casing (the gas turbine engine may be a turbofan engine, for example); and the electrical panel may form at least a part of a radially extending splitter (which may be referred to as a bifurcation) that extends across the bypass flow duct. In this way, an electrical panel (which may be referred to as a splitter electrical panel) may provide an electrical connection between a fan casing and an engine core. As explained elsewhere herein, one or more electrical panels may be attached to the engine core case or engine fan case, for example to a mounting structure on such cases.

The electrical panel may be referred to herein as a rigid electrical panel, an electrical raft, a rigid raft, a rigid panel, a rigid electrical raft or simply as a panel or a raft. These terms may be considered to be interchangeable as used herein, and so, for example, any feature described in relation to an electrical raft, a rigid raft, a rigid electrical raft, a panel or a raft (or assemblies thereof) may, of course, apply to an electrical panel. Furthermore, the panel/raft may be at least a part of an electrical harness for a gas turbine engine, and thus may be referred to herein as an electrical harness raft or electrical harness panel.

In general, transferring electrical signals using first and second flexible printed circuits embedded in a rigid electrical panel can provide a number of advantages over transferring electrical signals using a conventional harness. For example, during assembly and in use, such panels may provide greater protection to their electrical conductors than conventional harnesses. Further, the use of such panels may significantly reduce the build and maintenance times of an engine, and/or reduce the possibility of errors occurring during such procedures. The panels can also provide weight and size advantages over conventional harnesses. Similar advantages accrue when fluids are transferred using an embedded fluid system of the rigid panel, for example in the form of fluid passages formed in the rigid material.

The electrical assembly described and/or claimed herein allows reliable connection of the first and second flexible printed circuits, thereby allowing the length of flexible printed circuits to be increased. The flexible printed circuits may be used in a harness for a gas turbine and may be embedded in a panel. Such reliable connection may be advantageous during manufacture of a panel and/or during operation of the gas turbine engine.

In general, the use of one or more flexible printed circuits and/or electrical rafts/panels may significantly reduce build time of an engine. For example, use of flexible printed circuits and/or electrical rafts/panels may significantly reduce the part count involved in engine assembly compared with a conventional harness arrangement. The number and/or complexity of the operations required to assemble an engine (for example to assemble/install an electrical system (or network) and/or other peripheral components, which may be referred to in general as engine dressing) may be reduced. For example, rather than having to install/assemble a great number of wires and/or wiring looms together on the engine installation, it may only be necessary to attach a relatively small number of electrical panels/electrical panel assemblies and/or flexible printed circuits, which themselves may be straightforward to handle, position, secure and connect. Thus, use of flexible printed circuits and/or electrical panels in a gas turbine installation may reduce assembly time and/or reduce the possibility of errors occurring during assembly.

Use of electrical panels/flexible printed circuits may provide significant advantages during maintenance, such as repair and overhaul. As discussed above, the electrical panels/flexible printed circuits may be particularly quick and straightforward to assemble to an engine. The same advantages discussed above in relation to assembly apply to disassembly/removal from the gas turbine engine. Thus, any repair/overhaul that requires removal of at least a part of the electrical harness may be simplified and/or speeded up through use of electrical panels/flexible printed circuits as at least a part of the electrical harness, for example compared with conventional harnesses. Use of electrical panels/flexible printed circuits may allow maintenance procedures to be advantageously adapted. For example, some maintenance procedures may only require access to a certain portion of the gas turbine engine that only requires a part of the harness to be removed. It may be difficult and/or time consuming, or not even possible, to only remove the required part of a conventional harness from a gas turbine engine. However, it may be relatively straightforward to only remove the relevant electrical panel/flexible printed circuit, for example by simply disconnecting it from the engine and any other electrical panels/components to which it is connected. Decreasing maintenance times has the advantage of, for example, reducing out-of service times (for example off-wing times for engines that are used on aircraft).

The build/assembly times may be additionally or alternatively reduced by pre-assembling and/or pre-testing individual and/or combinations of electrical panels and/or flexible printed circuits prior to engine assembly. This may allow the electrical and/or mechanical operation of the electrical panels to be proven before installation, thereby reducing/eliminating the testing required during engine installation.

The electrical panels/flexible printed circuits may be a particularly lightweight solution for transferring electrical signals around an engine. For example, they may be lighter, for example significantly lighter, than a conventional harness required to transmit a given number of electrical signals. A plurality of conductors may be embedded in a single electrical panel/flexible printed circuit, whereas in a conventional arrangement a large number of heavy, bulky wires, usually with insulating sleeves, would be required. The reduced weight may be particularly advantageous, for example, when used on gas turbine engines on aircraft.

Electrical panels/flexible printed circuits may be more easily packaged and/or more compact, for example than conventional harnesses. Indeed, as mentioned above, the electrical panels can be made into a very wide range of shapes as desired. This may be achieved, for example, by manufacturing the electrical panels using a mould conforming to the desired shape. As such, each electrical panel may be shaped, for example, to turn through a tighter corner (or smaller bend radius) than a conventional harness. The electrical panels may thus provide a particularly compact solution for transferring electrical signals around a gas turbine engine. The electrical panels may be readily shaped to conform to neighbouring components/regions of a gas turbine engine, for example components/regions to which the particular electrical panel assembly is attached, such as a fan casing or a core casing as noted elsewhere herein.

Where the connected flexible printed circuits are embedded in an electrical panel, the electrical panel may provide improved protection to the electrical conductors during manufacture/assembly of the panel/gas turbine installation, and/or during service/operation/maintenance of the gas turbine engine. This may result in lower maintenance costs, for example due to fewer damaged components requiring replacement/repair and/or due to the possibility of extending time intervals (or service intervals) between inspecting the electrical system, for example compared with a system using only conventional harnesses.

Where the connected flexible printed circuits are embedded in electrical panels, it will be appreciated that the embedded flexible printed circuits and/or the connection arrangement may be described as being fixed in position by the rigid material, for example relative to the rest of the electrical panel. It will also be appreciated that the embedded flexible printed circuits and/or the connection between the first and second flexible printed circuits may be said to be surrounded by the rigid material and/or buried in the rigid material and/or integral with (or integrated into) the rigid material.

Other components/systems, for example of a gas turbine engine, may be provided to an electrical panel in any suitable manner. Thus, a surface of an electrical panel may be used as a mounting surface for other gas turbine engine components/systems, such as ancillary/auxiliary components/systems.

For example, an electrical unit may be mounted on an electrical panel. The electrical unit may be any sort of electrical unit, for example one that may be provided to a gas turbine engine. For example, the electrical unit may be any type of electronic control unit (ECU), such as an Electronic Engine Controller (EEC) and an Engine Health Monitoring Unit (EMU). Such an assembly may be a particularly convenient, lightweight and/or compact way of providing (for example attaching, fixing or mounting) an electrical unit to a turbine engine. For example, the electrical unit and the electrical panel may be assembled together (mechanically and/or electrically) before being installed on the gas turbine engine. Such an electrical unit may be connected to an outlet terminal of the first or second embedded flexible printed circuit, for example.

An electrical panel may be provided with at least one mount on which other components (for example auxiliary/ancillary components/systems) of the gas turbine engine are (or may be) mounted. The mount may be a bracket, for example a bespoke bracket for the component/system mounted thereon or a conventional/standard bracket. The electrical panel may provide a stable, regular and convenient platform on which to mount the various systems/components. The combination of the installed electrical panel assembly with components/systems mounted thereon may be much more compact and/or straightforward to assemble and/or have a greatly reduced number of component parts, for example compared with the corresponding conventional electrical harness and separately mounted components/systems.

The mounts may be used to attach any component/system to an electrical raft/panel (and thus to the engine) as required. For example, fluid pipes for transferring fluid around the engine may be mounted to the electrical rafts/panels (for example mechanically mounted using a bracket), and thus to the engine. More than one set of fluid pipes, for example for carrying different or the same fluids, may be mounted on the same electrical panel.

An anti-vibration mount may be used to attach an electrical panel to another component, thereby allowing the electrical panel to be vibration isolated (or at least substantially vibration isolated). Using an anti-vibration mount to attach an electrical panel to a gas turbine engine for example may reduce (or substantially eliminate) the amount (for example the amplitude and/or the number/range of frequencies) of vibration being passed to the electrical panel from the gas turbine engine, for example during use. This may help to prolong the life of the electrical panel. Furthermore, any other components that may be attached to the electrical panel (as discussed above and elsewhere herein) may also benefit from being mounted to the gas turbine engine via the anti-vibration mounts, through being mounted on the electrical panel. For example, the reduced vibration may help to preserve the electrical contact between the electrical raft/panel and any electrical unit connected thereto. As such, any components (such as an electrical unit mounted to the electrical panel) that would conventionally be mounted directly to the gas turbine engine and require at least a degree of vibration isolation no longer require their own dedicated anti-vibration mount. Thus, the total number of anti-vibration mounts that are required to assemble an engine may be reduced. This may reduce the number of parts required and/or the time taken to assemble an engine or engine installation and/or reduce the total assembled weight and/or reduce the likelihood of errors occurring during assembly.

Furthermore, components that are conventionally mounted to an engine without anti-vibration mounts (for example because of the weight and/or cost penalty), but which are now mounted to an electrical raft/panel (for example to a mounting surface of the electrical panel), may benefit from vibration isolation without any weight/cost/assembly time penalty. This may reduce the possibility of damage occurring to such components and/or increase their service life. Such components may include, for example, ignitor boxes (used to provide high voltage power to engine ignitors), and pressure sensors/switches, for example for fluid systems such as oil, air, fuel, pneumatics and/or hydraulics.

In use, the electrical signals transferred by first and/or second connected flexible printed circuits, and around the engine where the flexible printed circuits are used as part of an electrical harness of a gas turbine engine, may take any form. For example, the electrical signals may include, by way of non-limitative example, electrical power and/or electrical control/communication signals and/or any other type of transmission through an electrical conductor. Transmission of signals around the engine may mean transmission of signals between (to and/or from) any number of components/systems in the engine and/or components/system of a structure (such as an airframe) to which the gas turbine engine is (or is configured to be) connected/installed in. In other words, flexible printed circuits (which may optionally be embedded in a rigid material to form an electrical panel, as described herein) may be used to transfer/communicate any possible combination of electrical signals in any part of a gas turbine engine installation or a related (for example electrically and/or mechanically connected) structure/component/system.

BRIEF DESCRIPTION OF THE DRAWINGS

Examples of the disclosure will now be described by way of non-limitative example with reference to the accompanying drawings in which.

DETAILED DESCRIPTION OF EMBODIMENTS

Figure 1:
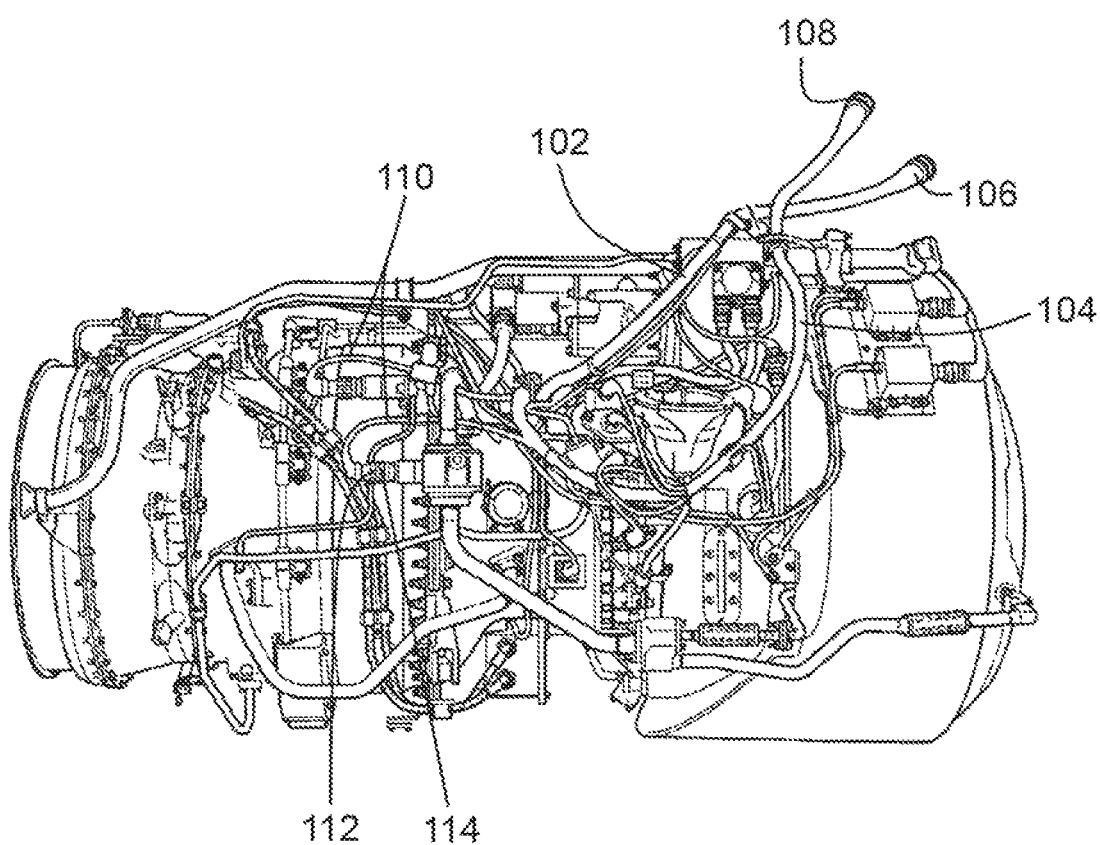
FIG. 1 shows a gas turbine engine with a conventional harness.
Figure 2:
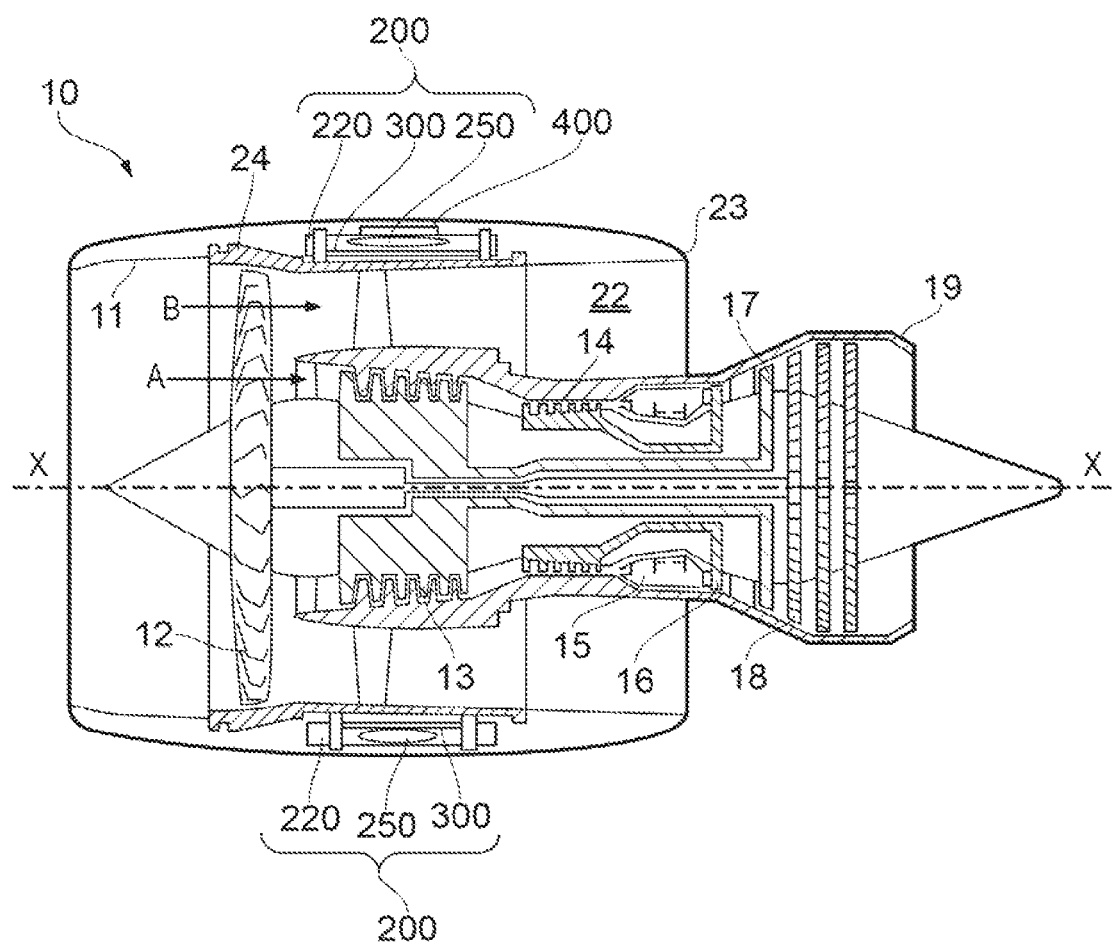
FIG. 2 shows a cross-section through a gas turbine engine having two connected flexible printed circuits in accordance with the present disclosure.

With reference to FIG. 2, a ducted fan gas turbine engine generally indicated at 10 has a principal and rotational axis X-X. The engine 10 comprises, in axial flow series, an air intake 11, a propulsive fan 12, an intermediate pressure compressor 13, a high-pressure compressor 14, combustion equipment 15, a high-pressure turbine 16, and intermediate pressure turbine 17, a low-pressure turbine 18 and a core engine exhaust nozzle 19. The engine also has a bypass duct 22 and a bypass exhaust nozzle 23.

The gas turbine engine 10 works in a conventional manner so that air entering the intake 11 is accelerated by the fan 12 to produce two air flows: a first air flow A into the intermediate pressure compressor 13 and a second air flow B which passes through the bypass duct 22 to provide propulsive thrust. The intermediate pressure compressor 13 compresses the air flow A directed into it before delivering that air to the high pressure compressor 14 where further compression takes place.

The compressed air exhausted from the high-pressure compressor 14 is directed into the combustion equipment 15 where it is mixed with fuel and the mixture combusted. The resultant hot combustion products then expand through, and thereby drive the high, intermediate and low-pressure turbines 16, 17, 18 before being exhausted through the nozzle 19 to provide additional propulsive thrust. The high, intermediate and low-pressure turbines 16, 17, 18 respectively drive the high and intermediate pressure compressors 14, 13 and the fan 12 by suitable interconnecting shafts.

The gas turbine engine 10 shown in FIG. 2 shows two electrical panels 200 according to examples of the disclosure. As such, the gas turbine engine 10 is in accordance with the present disclosure. The electrical panels 200 may be referred to as rigid electrical panels 200. The electrical panels 200 may be used to transmit/transfer electrical signals (or electricity, including electrical power and/or electrical control signals) around the engine and/or to/from the engine 10 from other components, such as components of an airframe.

The function and/or construction of each electrical panel 200 may be as described and/or claimed herein.

Figure 6:
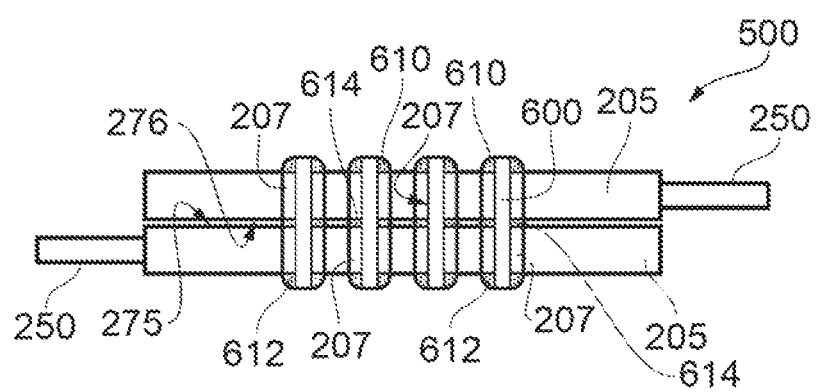
FIG. 6 shows a schematic close-up view of a connection between first and second flexible printed circuits in accordance with an example of the present disclosure.
Figure 7:
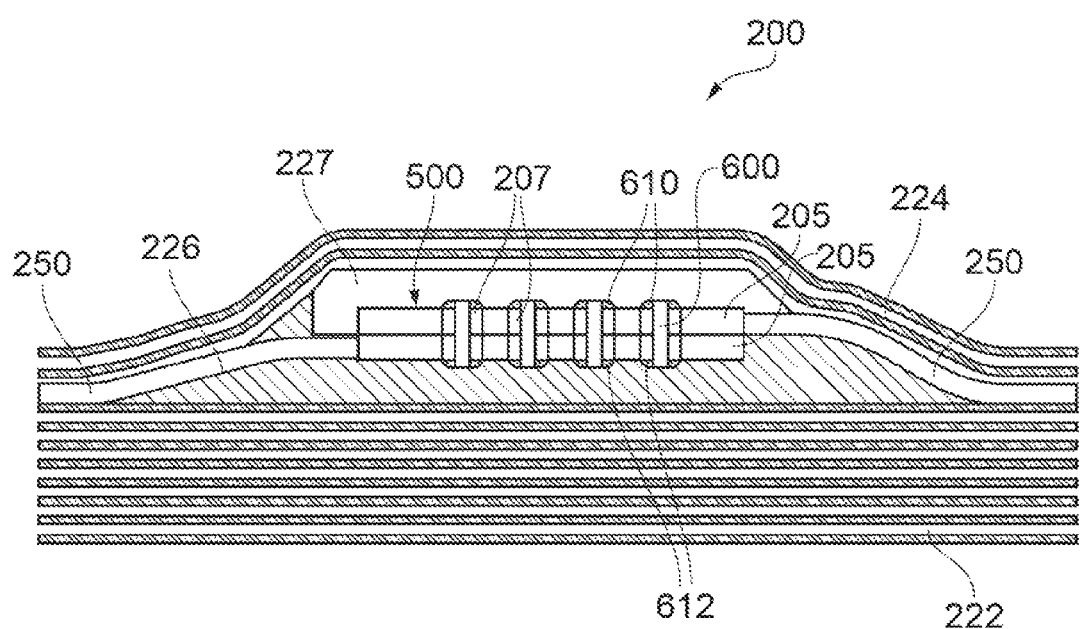
FIG. 7 shows a schematic of a portion of an electrical panel having a connection between first and second flexible printed circuits embedded therein.

The electrical panels 200 each comprise a rigid material 220 and two connected flexible printed circuits 250 (referred to elsewhere herein individually as 250A and 250B). The connection between the flexible printed circuits 250A and 250B is described in greater detail elsewhere herein, and examples of the connection are shown in FIGS. 6 and 7.

Figure 8:
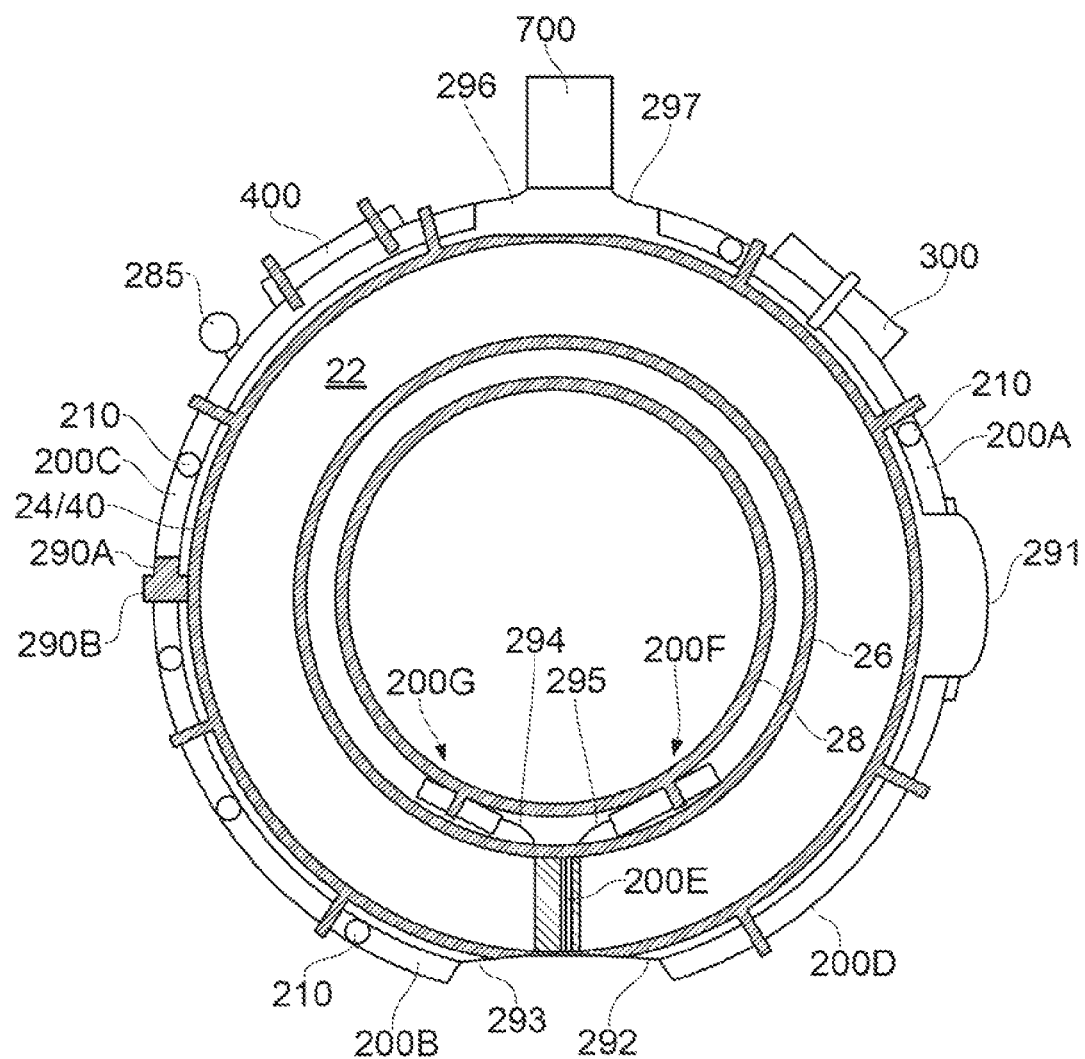
FIG. 8 shows a cross-section normal to the axial direction through a gas turbine engine having connected flexible printed circuits in accordance with the present disclosure.

The gas turbine engine 10 may additionally or alternatively comprise at least two flexible printed circuits connected 250 together as described and/or claimed herein that are not embedded in a rigid material (as described by way of example in relation to FIG. 8). The at least two connected flexible printed circuits 250, whether or not embedded in an electrical panel 200, may form part of an electrical harness of the gas turbine engine 10, as in the FIG. 2 example.

The electrical panels 200 shown purely by way of example in FIG. 2 also comprise an electromagnetic protection layer 300. However, such an electromagnetic protection layer 300 is entirely optional, and any electrical panel 200 in accordance with the present disclosure may or may not include such an electromagnetic protection layer 300. Where present, the electromagnetic protection layer 300 may comprise any suitable material (such as a conductive material, such as metal, for example copper), and be over any suitable form (such as a foil, mesh, or continuous layer). The electromagnetic protection layer 300, where present, may help to provide protection against the effects of lightning strike, for example.

Figure 3:
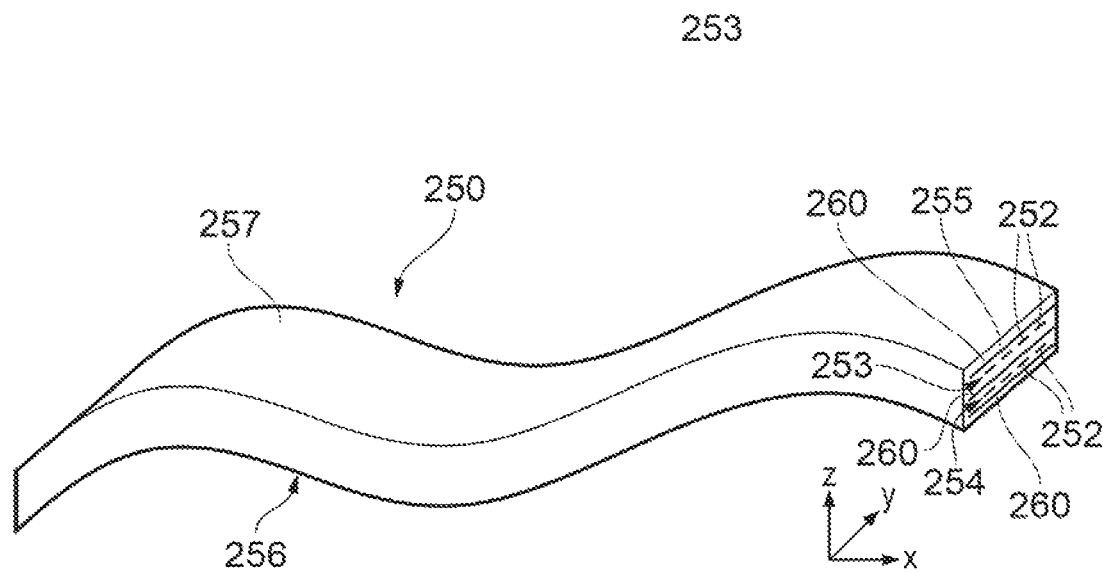
FIG. 3 shows a schematic perspective view of a portion of a flexible printed circuit.
Figure 4:
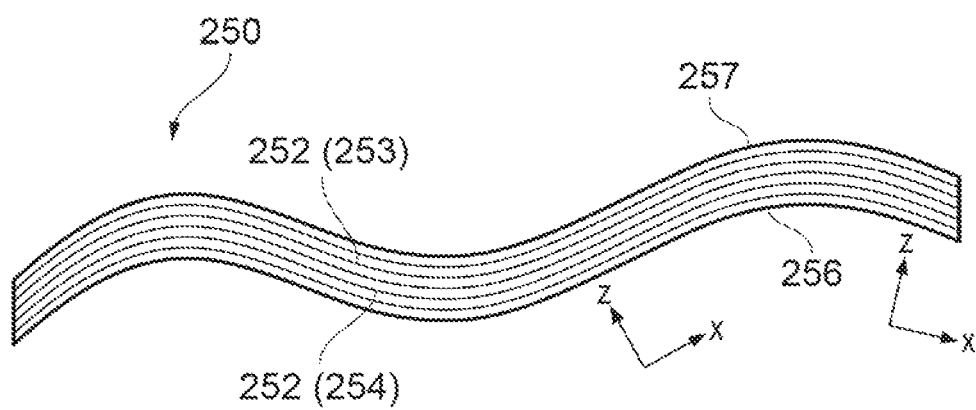
FIG. 4 shows a side view of the flexible printed circuit of FIG. 3.

FIGS. 3 and 4 show an individual flexible printed circuit 250 in greater detail. The flexible printed circuit typically comprises a flexible (for example elastically deformable) substrate 255 with conductive tracks 252 laid/formed therein. The flexible printed circuit 250 may thus be deformable. The flexible printed circuit 250 may be a thin body (in the z-direction shown in FIGS. 3 and 4) of generally elongate form (extending in the x-direction in FIGS. 3 and 4), having an upper major surface 257 and a lower major surface 256 separated by a thickness (in the z-direction). The flexible printed circuit 250 may be said to extend along a length in the x-direction, a width in the y-direction, and a thickness (or height or depth) in the z-direction. The x direction may be defined as the axial direction of the flexible printed circuit 250. Thus, the x-direction (and thus the z-direction) may change along the length of the flexible printed circuit 250 as it is deformed. The x-y surface(s) may be said to be the major surface(s) 256, 257 of the flexible printed circuit 250. In the example shown in FIGS. 3 and 4, the flexible printed circuit 250 is deformable in the z direction, i.e. in a direction perpendicular to the major surface 256, 257. Flexible printed circuits 250 may be additionally of alternatively deformable about any other direction, and/or may be twisted about any one or more of the x, y, or z directions.

The electrical tracks 252 in the FIG. 3 example are arranged in layers 253, 254, with each layer 253, 254 being substantially parallel to the upper and/or major surfaces 256, 257. A flexible printed circuit 250 may have any number of layers 253, 254 of electrical tracks 252, for example 1, 2 (as in the example of FIGS. 3 and 4), 3, 4, 5, or more than 5 layers 253, 254.

The flexible substrate 255 may be a dielectric. The conductive tracks 252, which may be said to be surrounded be the substrate 255, may be formed using a suitable conductive material. The conductive tracks 252 may be used to conduct/transfer electrical signals (including electrical power), for example around a gas turbine engine 10 and/or to/from components of a gas turbine engine 10. The size (for example the cross-sectional area) and/or the shape of the conductive tracks 252 may depend on the signal to be transmitted through the particular conductive track 252. Thus, the shape and/or size of the individual conductive tracks 252 may or may not be uniform in a flexible printed circuit 250.

The flexible printed circuit 250 may or may not comprise at least one integral electromagnetic shield 260, such as that shown in the example of FIGS. 3 and 4. The flexible printed circuit 250 may have an integral electromagnetic shield 260 adjacent one or both of the upper major surface 257 and the lower major surface 256. Each electrical track 252 may have at least one integral electromagnetic shield 260 between itself and one or both of the upper major surface 257 and the lower major surface 256.

The flexible printed circuit 250 may have any suitable number of integral electromagnetic shields 260 (including no integral electromagnetic shields 260). Each electromagnetic shield may be a conductive layer, such as a metallic layer. In the example of FIGS. 3 and 4, alternate layers of electrical tracks 252 and integral electromagnetic shield 260 are provided, but any other suitable arrangement may be used. For example, two, three, four, five or more than five layers of electrical tracks 252 may be provided between each electromagnetic shield 260 (where an electromagnetic shield 260 is present). Some arrangements may only have an electromagnetic shield adjacent one or both of the upper major surface 257 and the lower major surface 256. Where present, the or each integral electromagnetic shield 260 in the flexible printed circuit 250 may provide protection (or shielding) to the electrical tracks from electromagnetic interference. An integral electromagnetic shield 260 may help to provide shielding to high intensity radiated fields (HIRF), such as those produced by radar, TV signals and mobile phone signals, for example. Such an electromagnetic shield 260 may provide a degree of attenuation (or protection) against the effects of a lightning strike, for example providing a degree of protection against the secondary effects of lightning strike, such as cross-talk between electrical tracks/conductors.

Using a flexible printed circuit 250 to transmit electrical signals and/or power can be advantageous over a conventional harness, for example because of its reduced size, weight and/or complexity. However in order to provide particularly long flexible printed circuits (such as may be required for an electrical harness of a gas turbine engine 10, at least a part of which may or may not be embedded in a rigid electrical panel 200), it may be necessary to join one or more flexible printed circuits 250 together. A method and apparatus for reliably joining flexible printed circuits 250 together is described below by way of example in relation to FIGS. 5, 6 and 7.

Figure 5:
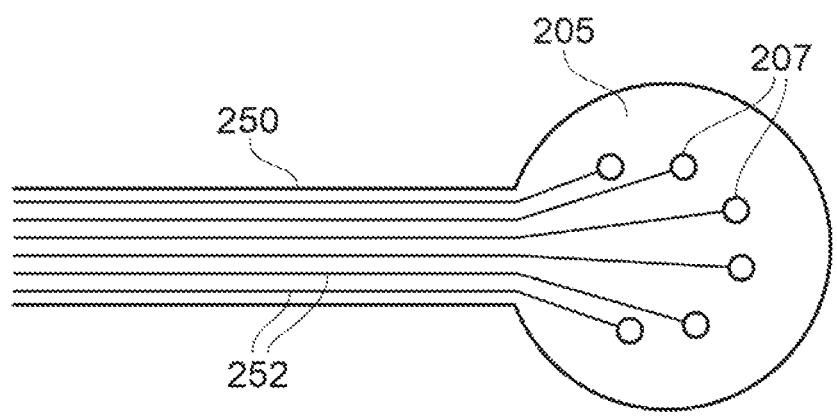
FIG. 5 shows schematically a portion of a flexible printed circuit board including a terminating region.

FIG. 5 shows an end portion of a flexible printed circuit 250. The flexible printed circuit 250 may be as described and/or claimed herein, and comprises multiple electrically conductive tracks 252. The electrically conductive tracks 252 may be arranged in layers 253, 254 as described by way of example in relation to FIG. 4. The flexible printed circuit 250 has a terminating region 205. The terminating region 205 may be said to be at an end of the flexible printed 250. The terminating region 205 may be any suitable shape, for example disc shaped. Terminating regions 205 may be provided at one or both ends of a flexible printed circuit 250 and the electrical connection arrangement may be provided at one or both ends of a flexible printed circuit 250, such that at least two flexible printed circuits may be connected together, or daisy-chained.

The electrically conductive tracks 252 terminate in the terminating region 205. The electrically conductive tracks 252 terminate at terminating holes 207. The electrically conductive tracks 252 are in electrical contact with the terminating holes 207. The terminating holes 207 may themselves be electrically conductive. For example, the terminating holes 207 may be coated with an electrically conductive material, such as a metal.

At least one terminating hole 207 may be electrically connected to an electrical track 252. At least one terminating hole 207 may be electrically connected to at least one (for example 1, 2, 3, 4, 5 or more than 5) electromagnetic shield layer 260.

FIG. 6 shows an example of two flexible printed circuits 250 electrically connected together. The connected flexible printed circuits 250 form an electrical assembly 500. To form the electrical assembly 500, the terminating regions 205 of the two flexible printed circuits 250 are placed next to each other, that is adjacent each other. The upper (or first) major surface 275 of the terminating region 205 of one flexible printed circuit 250 is placed next to the lower (or second) major surface 276 of the terminating region 205 of the other flexible printed circuit 250.

Respective terminating holes 207 of the two terminating regions 205 are aligned, for example their longitudinal axes may be said to be collinear. A connection pin 600 is placed through the aligned terminating holes 207 so as to form an electrical connection. The connection pin 600 may be referred to as an electrically conductive connection pin 600. Accordingly, respective terminating holes 207 of the two flexible printed circuits 250 can be electrically connected. In this way, electrically conductive tracks 252 and/or electromagnetic shielding layers 260 of the first and second flexible printed circuits 250 may be electrically connected together.

The connection pin 600 bridging between respective terminating holes 207 of the two flexible printed circuits 250 is permanently bonded in position. This may secure the pin 600 in position and/or ensure that the electrical connection is robust, for example by preventing ingress of contaminants. The connection pin 600 may be soldered in position, for example. The pin 600 may be bonded to each flexible printed circuit 250 at the major surfaces that face away from each other, that is the major surfaces that are not adjacent each other in the electrical assembly 500, as indicated by the features 610 and 612 in the FIG. 6 arrangement. The connection pin 600 may extend beyond those major surfaces in order to provide a particularly suitable bonding site, as shown in FIG. 6, although this may not be the case in some arrangements. The connection pin 600 and the first and second flexible printed circuits may be bonded at the interface between the two adjacent major surfaces 275, 276 of the terminating regions 205, as shown by the feature 614 in Figure the FIG. 6 example. However, one or more of the three general bonding sites 610, 612, 614 described above may not be used. For example, although FIG. 6 shows a gap between the two adjacent major surfaces 275, 276 of the terminating regions 205, some arrangements may not have such a gap, such that the two adjacent major surfaces 275, 276 are in direct contact. In that case no bonding 614 between the two surfaces 275, 276 would be provided. The bonding sites shown and described in relation to FIG. 6 are purely exemplary, and it will be appreciated that additional/alternative possible bonding sites in accordance with the invention may be used.

FIG. 7 shows a rigid electrical panel 200 comprising an electrical assembly 500. The electrical assembly 500 may be as described and/or claimed herein, for example in relation to FIG. 6. The electrical assembly 500 may be said to be embedded in the rigid electrical panel 200, for example in the rigid material 220. During manufacture, first and second flexible printed circuits 250 may be joined together (for example their electrical tracks 252 and/or electromagnetic shield layer(s) 260 may be joined together) in the electrical assembly 500 prior to assembly of the electrical panel 220.

The example of rigid electrical panel 200 shown in FIG. 7 has a rigid composite base layer 222, which may be referred to as a structural layer and/or may provide the structural requirements (for example in terms of stiffness and/or strength) of the electrical panel 200.

The base layer 222 may comprise carbon fibre. The rigid electrical panel 200 of FIG. 7 also comprises a covering layer 224, which may be referred to as a cosmetic layer 224. The covering layer may comprise any suitable material, such as polymer, which may or may not be reinforced, for example to form an organic matrix composite such as carbon fibre. The base layer 222 and the cosmetic layer 224 may be referred to, alone or in combination, as a rigid material 220 of the rigid electrical panel 200.

The first and second flexible printed circuits 250 and the electrical assembly 500 are embedded in the rigid material 220. For example, as shown in the FIG. 7 example, the first and second flexible printed circuits 250 and the electrical assembly 500 may be embedded between the base layer 222 and the covering layer 224. The panel 200 may also comprise insulating layers 226, 227, which provide electrical insulation to the electrical assembly 500, as in the FIG. 7 example. The insulating layers 226, 227 may, for example, comprise polyetheretherketone (PEEK), and may provide mechanical protection to the electrical assembly. Some arrangements may not include the insulating layers 226, 227.

During assembly, the electrical assembly 500, including with the first and second flexible printed circuits 250, may be laid onto the base layer 222, along with any insulating layers 226, 227. The covering layer 224 may then be provided on top of the electrical assembly 500 and first and second flexible printed circuits 250. The method of manufacturing the panel 200 may comprise providing heat and/or pressure, for example by curing. The permanently bonded (for example soldered) electrical connection between the first and second flexible printed circuits 250 using the connection pin 600 may be particularly appropriate during manufacture of the panel 200, for example because the connection is robust and resistant against ingress of contaminants during the manufacture (for example during a curing step).

FIG. 8 is a schematic showing a cross-section perpendicular to the direction X-X of a gas turbine engine comprising electrical panels 200A-200G. Any one of the electrical panels 200A-200G may comprise any or all of the features of an electrical panel 200 as described and/or claimed herein, for example. Thus, for example, any one of the electrical panels 200A-200G may comprise a rigid material 220 having embedded therein an electrical assembly 500 comprising first and second flexible printed circuits 250 connected together as described and/or claimed herein. The detailed construction of the electrical panels 200 is not shown in FIG. 8 for simplicity.

The electrical panels 200A-200D are mounted to a fan case 24, the electrical panel 200E is part of a bifurcation splitter that radially crosses a bypass duct 22, and the electrical panels 200F, 200G are mounted to an engine core case 28. However, it will be appreciated that an electrical panel 200 could be mounted in any suitable and/or desired location on a gas turbine engine 10.

In FIG. 8, two electrical panels 200A, 200C are shown as having an electrical unit 400 mounted thereon. However, any (or none) of the electrical panels 200A-200G may have an electrical unit 400 mounted thereon.

As mentioned herein, each of the electrical panels 200 shown in FIG. 8 comprises one or more electrical conductors 252 embedded therein, in the form of flexible printed circuits 250.

However, any one or more of the electrical panels 200 may be replaced with a panel that does not comprise electrical conductors 252. Such a panel (or raft) would not be an electrical panel 200, but may otherwise be as described elsewhere herein, for example it may be a rigid panel that may have components/systems (such as, by way of example only, fluid systems, such as pipes) mounted thereon and/or embedded therein. Thus, for example, a gas turbine engine in accordance with the present invention may have a combination of electrical panels 200 and non-electrical panels.

The arrangement of electrical panels 200A-200G shown in FIG. 8 is by way of example only. Alternative arrangements, for example in terms of number, size, shape and/or positioning, of electrical panels 200A-200G may be used. For example, there need not be seven electrical panels 200, the panels may or may not be connected together, and the panels could be provided to (for example mounted on) any one or more components of the gas turbine engine 10. Purely by way of example only, connection between electrical panels 200A-200D mounted on the fan casing 24 to the electrical panels 200F, 200G mounted on the core casing 28 may be provided at least in part by means other than an additional electrical panel 200E, for example using wire conductors with insulating sleeves. By way of further example, one or more electrical panels 200 may additionally or alternatively be provided to the nose cone, structural frames or elements within the engine (such as "A-frames"), the nacelle, the fan cowl doors, and/or any connector or mount between the gas turbine engine 10 and a connected structure (which may be at least a part of a structure in which the gas turbine engine 10 is installed), such as the pylon 700 between the gas turbine engine 10 and an airframe (not shown).

Any one or more of the electrical panels 200A-200G may have a fluid passage 210 embedded therein and/or provided thereto. The fluid passage 210 may be part of a fluid system, such as a gas (for example pneumatic or cooling gas/air) and/or liquid (for example a fuel, hydraulic and/or lubricant liquid). In the FIG. 8 example, three of the electrical panels 200A-200O comprise a fluid passage 210 at least partially embedded therein. The electrical panel 200C also has a fluid passage 285 (which may be for any fluid, such as those listed above in relation to embedded passage 210) mounted thereon. Such a mounted fluid passage 285 may be provided to any electrical panel 200, such as those shown in FIG. 8. The fluid passages 210, 285 shown in FIG. 8 may be oriented in an axial direction of the engine 10. However, fluid passages 210, 285 may be oriented in any direction, for example axial, radial, circumferential or a combination thereof. Of course, rigid electrical panels 200 comprising fluid passages 210 may be used in other applications outside a gas turbine engine 10.

Any of the electrical panels 200A-200G may have any combination of mechanical, electrical and/or fluid connections to one or more (for example 2, 3, 4, 5 or more than 5) other components/systems of the gas turbine engine 10 and/or the rest of the gas turbine engine 10. Examples of such connections are shown in FIG. 8, and described below, but other connectors may be used. For example, electrical panels 200 (and/or non-electrical panels) may be connected together (or to other components) using any combination of electrical, fluid and/or mechanical connectors. Thus, any of the connections 290A/290B, 291-297 shown in FIG. 8 may be any combination of electrical, fluid and/or mechanical connection. Alternatively, electrical panels 200 (and/or non-electrical panels) may be standalone, and thus may have no connection to other panels or components.

A connection 291 is shown between the electrical panels 200A-200D, and this connection may be via a flexible printed circuit outlet terminal. The connection 291 may comprise an electrical connection. Such an electrical connection may be flexible and may, for example, take the form of a flexible printed circuit such as the flexible printed circuit 250 and may comprise an electrical assembly 500 including the connection between the first and second flexible printed circuits 250 as described and/or claimed herein. Such an electrical assembly 500 may be used to electrically connect any electrical panel 200 to any other component, such as another electrical panel 200. A connection 297 (which may be or comprise an electrical connection) is provided between the electrical panel 200A and a part of an airframe, or airframe installation 700, which may, for example, be a pylon. Similarly, a fluid and/or mechanical connection 296 may additionally or alternatively be provided between the airframe 700 and another electrical panel 200C. As shown in FIG. 8, other electrical and/or fluid connections 292, 293, 294, 295 may be provided between electrical panels 200 and other components, such as other electrical panels 200.

A direct connection 290A, 290B may be provided, as shown for example between the electrical panels 200B, 200C. Such a direct connection 290A, 290B may comprise a connector 290A provided on (for example embedded in) one electrical panel 200 connected to a complimentary connector 290B provided on (for example embedded in) another electrical panel 200. Such a direct connection 290A, 290B may, for example, provide fluid and/or electrical connection between the two electrical panels 200B, 200C. Such direct connectors 290A, 290B may be electrically connected to an embedded FPC 250, and may be examples of a flexible printed circuit outlet terminal.

A gas turbine engine 10 in accordance with the present disclosure may not have any rigid electrical panels 200. Such a gas turbine engine may have an electrical harness that has one or more electrical assemblies 500 (comprising connected first and second flexible printed circuits 250) as described and/or claimed herein that are not embedded in rigid electrical panels 200. Some arrangements of gas turbine engines 10 in accordance with the present disclosure may have a combination of electrical assemblies 500 as described and/or claimed herein embedded in rigid panels 200 and electrical assemblies 500 as described and/or claimed herein that are not embedded in rigid electrical panels 200.

Where reference is made herein to a gas turbine engine, it will be appreciated that this term may include a gas turbine engine/gas turbine engine installation and optionally any peripheral components to which the gas turbine engine may be connected to or interact with and/or any connections/interfaces with surrounding components, which may include, for example, an airframe and/or components thereof. Such connections with an airframe, which are encompassed by the term "gas turbine engine" as used herein, include, but are not limited to, pylons and mountings and their respective connections. The gas turbine engine itself may be any type of gas turbine engine, including, but not limited to, a turbofan (bypass) gas turbine engine, turbojet, turboprop, ramjet, scramjet or open rotor gas turbine engine, and for any application, for example aircraft, industrial, and marine application. Electrical panels 200 such as any of those described and/or claimed herein may be used as part of any apparatus, such as any vehicle, including land, sea, air and space vehicles, such as motor vehicles (including cars and busses), trains, boats, submarines, aircraft (including aeroplanes and helicopters) and spacecraft (including satellites and launch vehicles).

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the scope of the invention.

For example, it will be appreciated that many alternative configurations and/or arrangements of electrical panels 200, electrical connection assemblies 500 and gas turbine engines 10 comprising electrical panels 200 and/or electrical connection assemblies 500 other than those described herein may fall within the scope of the invention. For example, alternative arrangements of electrical panels 200 (for example in terms of the arrangement, including number/shape/positioning/constructions, of mounting fixtures, the arrangement/shape/positioning/construction of the electrical panels 200, the type and/or positioning of components (if any) mounted to/embedded in the electrical panels 200, the rigid material 220 and the electrical conductors 252) may fall within the scope of the invention and may be readily apparent to the skilled person from the disclosure provided herein. Alternative arrangements of connections (for example mechanical, electrical and/or fluid) between the electrical (or non-electrical) panels and/or assemblies thereof and between the electrical (or non-electrical) panels and/or assemblies thereof and other components may fall within the scope of the invention and may be readily apparent to the skilled person from the disclosure provided herein. Furthermore, any feature described and/or claimed herein may be combined with any other compatible feature described in relation to the same or another embodiment.

We claim:

1. An electrical assembly comprising a first flexible printed circuit and a second flexible printed circuit, each flexible printed circuit comprising:
   a plurality of respective electrically conductive tracks embedded in a flexible material; and
   a terminating region having terminating holes extending therethrough, each of the tracks of the flexible printed circuit terminating at a terminating hole, wherein:
   the respective terminating regions of the first and second flexible printed circuits are directly adjacent each other;
   the electrical assembly also comprises a plurality of connection pins, each of which extends between a respective terminating hole of the first and second flexible printed circuits;
   each connection pin is permanently bonded to its respective terminating holes so as to form a permanent electrical connection between respective tracks of the first and second flexible printed circuits;
   the terminating regions are substantially planar;
   each terminating hole has a longitudinal axis that is perpendicular to the terminating regions; and
   the terminating regions are positioned such that longitudinal axes of the terminating holes of the first flexible printed circuit are aligned with longitudinal axes of corresponding terminating holes of the second flexible printed circuit.

2. An electrical assembly according to claim 1, wherein the permanent bond is formed by an electrically conductive material.

3. An electrical assembly according to claim 1, wherein the permanent bond is formed by solder.

4. An electrical assembly according to claim 1, wherein at least one of the pins provides an electrical connection only between a single electrical track in the first flexible printed circuit and a single electrical track in the second flexible printed circuit.

5. An electrical assembly according to claim 1, wherein:
   each flexible printed circuit is a thin body having an upper major surface separated by a thickness from a lower major surface; and
   at least two layers of electrical tracks are embedded within the thickness of each flexible printed circuit.

6. An electrical assembly according to claim 5, wherein:
   at least two electromagnetic shielding layers are provided within the thickness of each flexible printed circuit, at least two of the shielding layers in each flexible printed circuit being electrically connected to the same terminating hole; and
   at least one connection pin is permanently bonded to the respective terminating holes of the first and second flexible printed circuits to which the shielding layers are connected so as to form a permanent electrical connection between at least two electromagnetic shielding layers of both the first flexible printed circuit and the second flexible printed circuit.

7. An electrical assembly according to claim 1, wherein the electrically conductive tracks embedded in the first flexible printed circuit are arranged to be substantially the same as the electrically conductive tracks embedded in the second flexible printed circuit.

8. An electrical assembly according to claim 1, wherein the inner surface of the terminating holes is electrically conductive.

9. A rigid electrical panel comprising the electrical assembly according to claim 1 embedded in a rigid material.

10. A rigid electrical panel comprising the electrical assembly according to claim 9 wherein at least a part of the rigid material is an organic matrix composite.

11. A rigid electrical panel according to claim 9, wherein the terminating regions and connecting pins are surrounded by an electrically insulating material.

12. An electrical system for a gas turbine engine or vehicle comprising an electrical panel according to claim 1.

13. An electrical system for a gas turbine engine or vehicle comprising an electrical assembly according to claim 9.

14. A gas turbine engine comprising an electrical panel according to claim 9, wherein
   the rigid electrical panel comprises at least one electrical connector having a first end that is embedded in the rigid material and is electrically connected to one or more electrical tracks of the first and/or second flexible printed circuit, and an exposed second end at which electrical terminals are provided for electrical connection to another electrical component; and
   the rigid electrical panel is mounted on a rigid structure of the gas turbine engine.

15. A method of electrically connecting a first flexible printed circuit to a second flexible printed circuit, each flexible printed circuit comprising:
   a plurality of electrically conductive tracks embedded in a flexible material; and
   a terminating region having terminating holes extending therethrough, each of the tracks of the flexible printed circuit terminating at a terminating hole,
   the method comprising:
   positioning the respective terminating regions of the first and second flexible printed circuits directly adjacent each other;
   providing a connection pin between respective adjacent terminating holes of the first and second flexible printed circuits;
   permanently bonding the connection pin to its respective terminating holes so as to form a permanent electrical connection between respective tracks of the first and second flexible printed circuits;
   laying the connected flexible printed circuits onto an organic matrix composite;
   covering the connected flexible printed circuits with a covering material so as to sandwich the connected flexible printed circuits between the organic matrix composite and the covering material to form an assembly; and
   curing the assembly to form a rigid electrical panel having the connected flexible printed circuits embedded between a cured organic matrix composite and the covering material.

* * * * *